(12) United States Patent
Bathan et al.

(10) Patent No.: US 8,569,872 B2
(45) Date of Patent: Oct. 29, 2013

(54) INTEGRATED CIRCUIT PACKAGE SYSTEM WITH LEAD-FRAME PADDLE SCHEME FOR SINGLE AXIS PARTIAL SAW ISOLATION

(75) Inventors: Henry Descalzo Bathan, Singapore (SG); Il Kwon Shim, Singapore (SG); Zigmund Ramirez Camacho, Singapore (SG); Philip Lyndon Cablao, Singapore (SG); Jose Alvin Caparas, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 550 days.

(21) Appl. No.: 12/166,169

(22) Filed: Jul. 1, 2008

(65) Prior Publication Data

US 2010/0001384 A1      Jan. 7, 2010

(51) Int. Cl.
*H01L 23/495* (2006.01)

(52) U.S. Cl.
USPC .......................................... 257/676; 438/123

(58) Field of Classification Search
USPC .......................................... 257/676; 438/123
See application file for complete search history.

(56) References Cited

U.S. PATENT DOCUMENTS

| | | | |
|---|---|---|---|
| 5,019,893 A | 5/1991 | Frank et al. | |
| 5,084,753 A | 1/1992 | Goida et al. | |
| 6,160,307 A | 12/2000 | Kweon | |
| 6,388,311 B1 * | 5/2002 | Nakashima et al. | 257/676 |
| 6,489,678 B1 | 12/2002 | Joshi | |
| 6,917,097 B2 | 7/2005 | Chow et al. | |
| 6,927,482 B1 | 8/2005 | Kim et al. | |
| 7,008,825 B1 | 3/2006 | Bancod et al. | |
| 7,157,312 B2 | 1/2007 | Kim et al. | |
| 7,170,150 B2 * | 1/2007 | Lee | 257/666 |
| 7,202,554 B1 | 4/2007 | Kim et al. | |
| 7,211,471 B1 * | 5/2007 | Foster | 438/123 |
| 7,242,076 B2 | 7/2007 | Dolan | |
| 7,456,053 B2 | 11/2008 | Lee et al. | |
| 7,518,156 B2 * | 4/2009 | Hasebe et al. | 257/98 |
| 2006/0284290 A1 | 12/2006 | Cheng | |
| 2007/0298544 A1 | 12/2007 | Oman | |
| 2009/0085181 A1 | 4/2009 | Advincula, Jr. et al. | |

OTHER PUBLICATIONS

Merriam-Webster Ninth New Collegiate Dictionary, Definition of "overlap", Merriam-Webster Inc., Springfield, MA, 1989, p. 841.

* cited by examiner

*Primary Examiner* — Jenny L Wagner

(74) *Attorney, Agent, or Firm* — Ishimaru & Associates LLP

(57) ABSTRACT

An integrated circuit package system includes: providing a die-pad with a predefined slot and an integrated circuit attached to the die-pad; connecting the integrated circuit to the die-pad with a bond wire; encapsulating the integrated circuit and the bond wire with an encapsulation; and partitioning the die-pad with partial saw isolation grooves along a single axis, and into a side pad, and a die attach pad.

20 Claims, 6 Drawing Sheets

INTEGRATED CIRCUIT PACKAGE SYSTEM WITH LEAD-FRAME PADDLE SCHEME FOR SINGLE AXIS PARTIAL SAW ISOLATION

CROSS-REFERENCE TO RELATED APPLICATION(S)

The present application contains subject matter related to U.S. patent application Ser. No. 11/863,700, now U.S. Pat. No. 8,067,825. The related application is assigned to STATS ChipPAC Ltd.

TECHNICAL FIELD

The present invention relates generally to integrated circuits and more particularly to a system for partitioning a die-pad along a single axis.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses, and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a die-pad with a predefined slot and an integrated circuit attached to the die-pad; connecting the integrated circuit to the die-pad with a bond wire; encapsulating the integrated circuit and the bond wire with an encapsulation; and partitioning the die-pad with partial saw isolation grooves along a single axis, and into a side pad, and a die attach pad.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
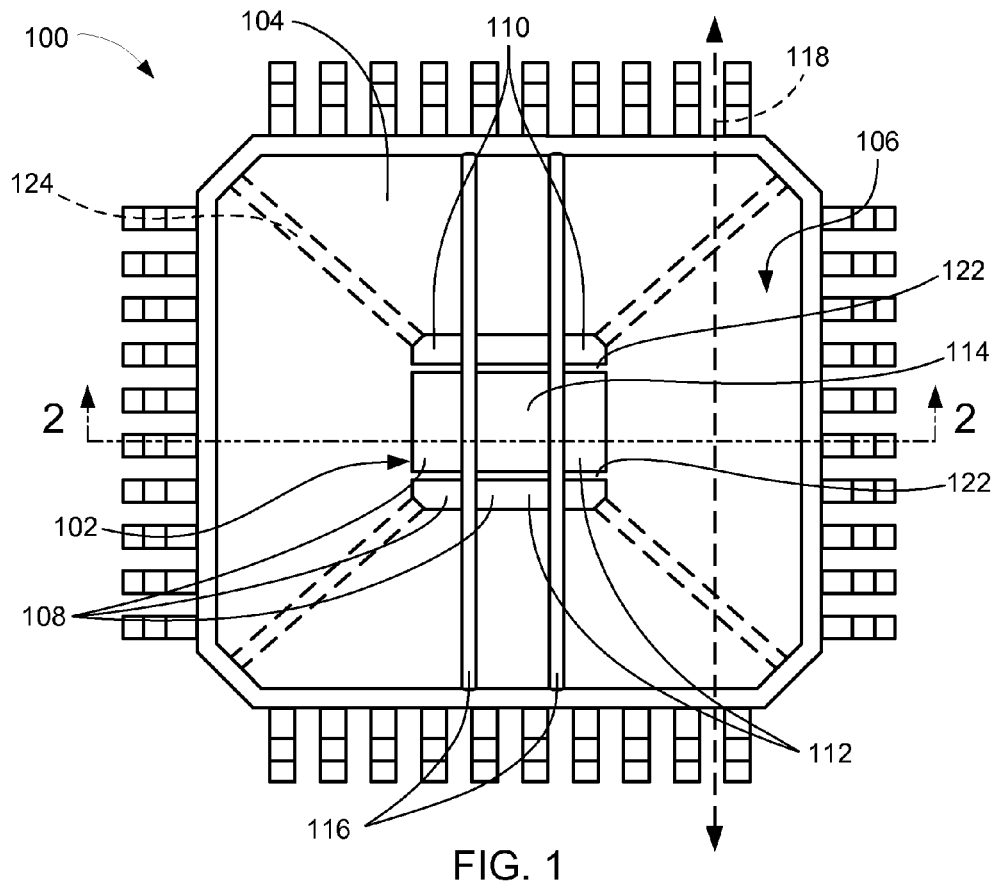
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the die-pad, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used.

Referring now to FIG. 1, therein is shown a bottom view of an integrated circuit package system 100 in a first embodiment of the present invention. The integrated circuit package system 100 is shown having a die-pad 102 exposed from a bottom surface 104 of an encapsulation 106 such as an epoxy mold compound (EMC).

The die-pad 102 has isolated pads 108 that are isolated on the bottom surface 104 of the encapsulation 106. The die-pad 102 has nine of the isolated pads 108. Four of the isolated pads 108 are corner pads 110, four of the isolated pads 108 are side pads 112, and one of the isolated pads 108 is a die attach pad 114. The die attach pad 114 is adjacent to the side pads 112.

The isolated pads 108 are made using partial saw isolation grooves 116. The partial saw isolation grooves 116 are made along a single axis 118 on the bottom surface 104 of the encapsulation 106.

It has been unexpectedly discovered that using the partial saw isolation grooves 116 along the single axis 118 greatly improves cycle time and throughput. This technique decreases manufacturing overhead costs per unit.

The die-pad 102 further has predefined slots 122. The predefined slots 122 are filled with the encapsulation 106 and are coplanar. The predefined slots 122 can extend across the die-pad 102 but not beyond. The die attach pad 114 has an edge with the predefined slots 122 collinear with the edge. The partial saw isolation grooves 116 can extend beyond the die-pad 102 and extend across the integrated circuit package system 100. The corner pads 110 have die attach paddle bars (DAP bars) 124 extending from the corner pads 110 away from the die-pad 102. The partial saw isolation grooves 116 are further shown overlapping the pre-defined slot 122. The partial saw isolation grooves 116 separates the side pads 112 from the die attach pad 114. The partial saw isolation grooves 116 are adjacent to the die attach pad 114.

Figure 2:
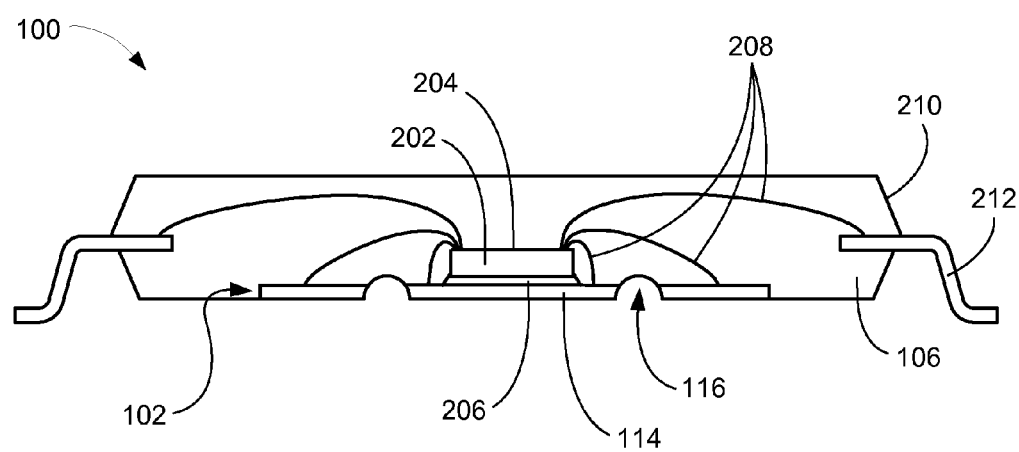
FIG. 2 is a cross-sectional view of the integrated circuit package system along the line 2-2 of FIG. 1.

Referring now to FIG. 2, therein is shown a cross-sectional view of the integrated circuit package system 100 along the line 2-2 of FIG. 1. The integrated circuit package system 100 is shown having an integrated circuit, such as a wire-bonded die 202 with an active side 204 attached to the die attach pad 114 of the die-pad 102.

The wire-bonded die 202 is attached to the die attach pad 114 with a die attach adhesive 206. The die attach adhesive 206 should be a highly thermal conductive material. The active side 204 of the wire-bonded die 202 is connected to the isolated pads 108 with bond wires 208.

The encapsulation 106 is shown having sides 210. Extending from the sides 210 are leads 212. The active side 204 of the wire-bonded die 202 is connected to the leads 212 with the bond wires 208. The encapsulation 106 is shown encapsulating the bond wires 208, and the wire-bonded die 202.

Figure 3:
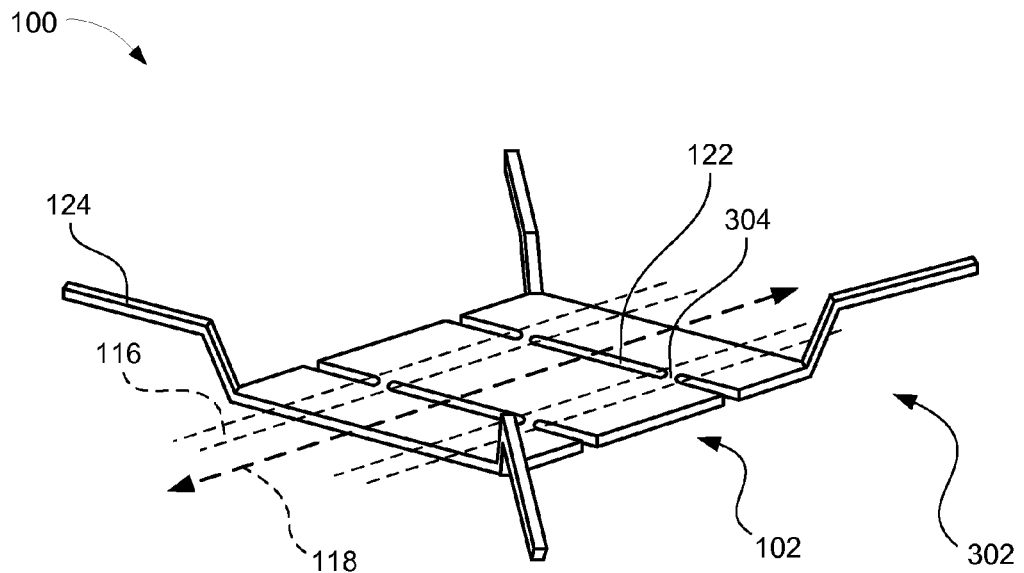
FIG. 3 is an isometric view of the integrated circuit package system of FIG. 2 in a lead-frame inspection phase of manufacture.

Referring now to FIG. 3, therein is shown an isometric view of the integrated circuit package system 100 of FIG. 2 in a lead-frame inspection phase of manufacture. The integrated circuit package system 100 is shown with a lead-frame 302. The lead-frame 302 comprises the DAP bars 124 elevated higher than and extending horizontally away from, the die-pad 102.

The predefined slots 122 of the die-pad 102 are connected with structural interconnects 304. The structural interconnects 304 are situated along and are no wider than the partial saw isolation grooves 116.

When the partial saw isolation grooves 116 are cut into the lead-frame 302 the structural interconnects 304 will be cut out of the lead-frame 302. The partial saw isolation grooves 116 will electrically isolate the die attach pad 114, from the side pads 112, and the corner pads 110.

Figure 4:
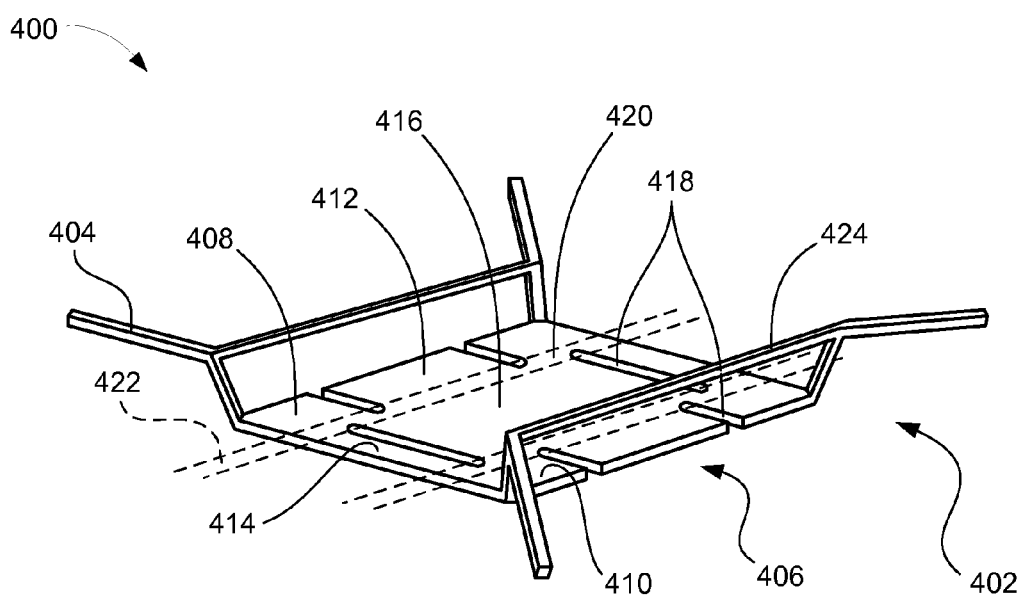
FIG. 4 is an isometric view of an integrated circuit package system in a second embodiment of the present invention, and in a lead-frame inspection phase of manufacture.

Referring now to FIG. 4, therein is shown an isometric view of an integrated circuit package system 400 in a second embodiment of the present invention, and in a lead-frame inspection phase of manufacture. The integrated circuit package system 400 is shown with a lead-frame 402 having DAP bars 404 and a die-pad 406.

The die-pad 406 has connected corner pads 408, an unconnected corner pad 410, thick side pads 412, thin side pads 414, and a die attach pad 416. The die-pad 406 also has predefined slots 418 and structural interconnects 420 along partial saw isolation paths 422 that are shown overlapping the pre-defined slots 418.

The predefined slots 418 are not coplanar making the thin side pads 414 thinner than the thick side pads 412. The DAP bars 404 are connected with an elevated lead-frame element such as side bars 424. The side bars 424 may connect any of the DAP bars 404, which are adjacent.

By connecting the DAP bars 404 with the side bars 424, the connected corner pads 408 are electrically connected after the partial saw isolation paths 422 are cut. The DAP bars 404 not connected with the side bars 424 will leave the unconnected corner pad 410 electrically isolated after the partial saw isolation paths 422 are cut.

Figure 5:
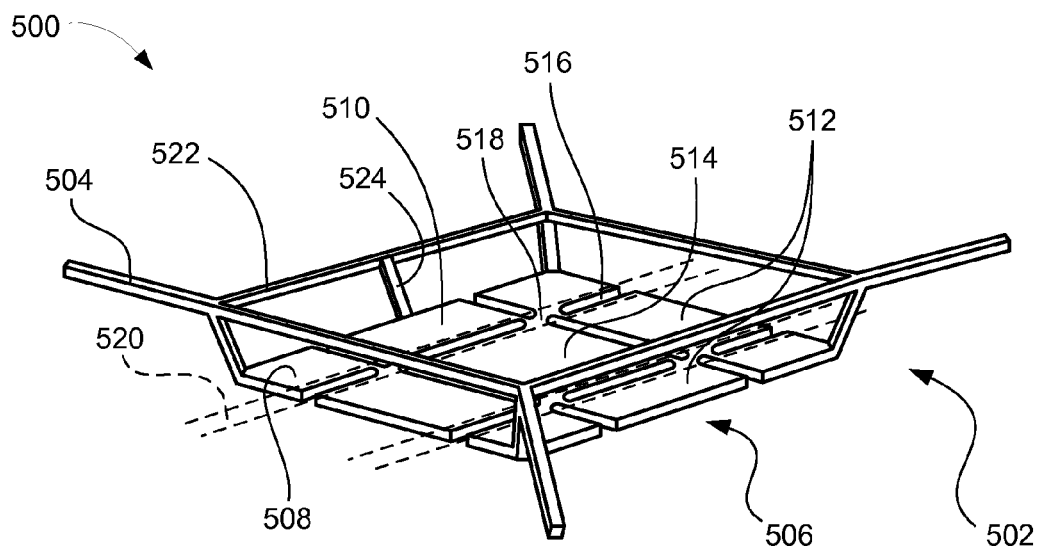
FIG. 5 is an isometric view of an integrated circuit package system in a third embodiment of the present invention, and in a lead-frame inspection phase of manufacture.

Referring now to FIG. 5, therein is shown an isometric view of an integrated circuit package system 500 in a third embodiment of the present invention, and in a lead-frame inspection phase of manufacture. The integrated circuit package system 500 is shown with a lead-frame 502 having DAP bars 504 and a die-pad 506.

The die-pad 506 has connected corner pads 508, a connected side pad 510, unconnected side pads 512, and a die attach pad 514. The die-pad 506 also has predefined slots 516 and structural interconnects 518 along partial saw isolation paths 520 that are shown overlapping the pre-defined slots 416.

The predefined slots 516 along the partial saw isolation paths 520 minimize the amount of the die-pad 506 material along the partial saw isolation paths 520 saw path and contributes to a more efficient sawing process and elimination of metal burrs.

The connected corner pads 508 are electrically connected by an elevated lead-frame element such as an elevated ring 522 connected to the DAP bars 504. The connected side pad 510 is electrically connected to the connected corner pads after the partial saw isolation grove 520 is cut by an elevated lead-frame element such as an additional tie bar 524.

Figure 6:
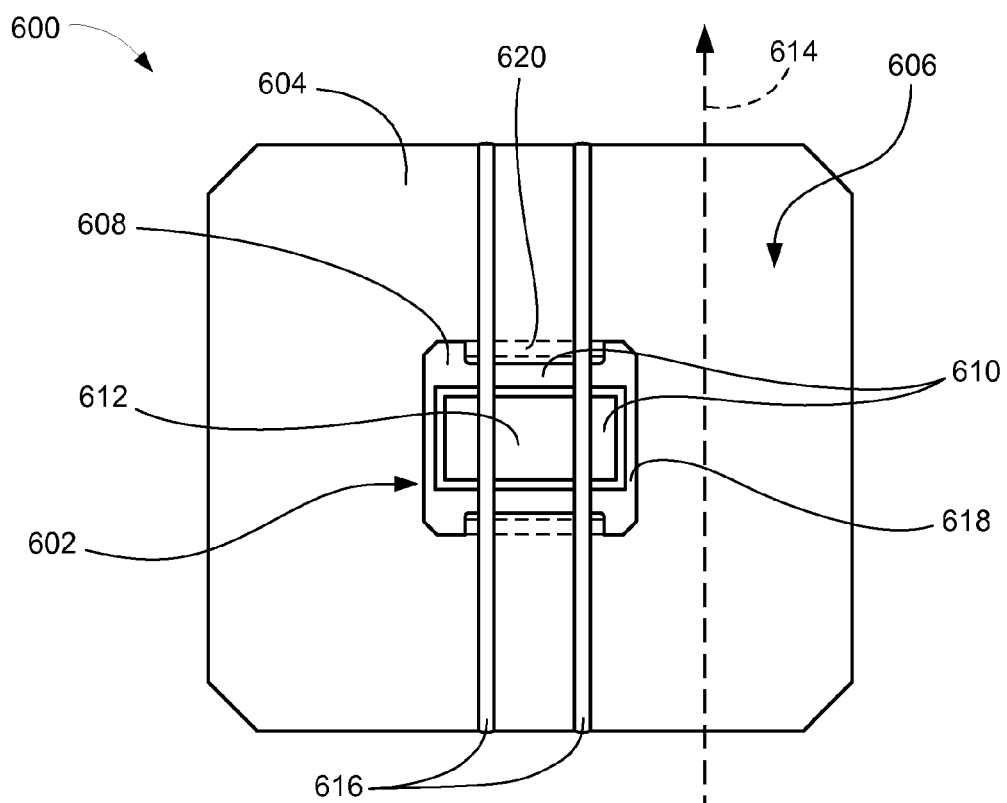
FIG. 6 is a bottom view of an integrated circuit package system in a fourth embodiment of the present invention.

Referring now to FIG. 6, therein is shown a bottom view of an integrated circuit package system 600 in a fourth embodiment of the present invention. The integrated circuit package system 600 is shown having a die-pad 602 exposed from a bottom surface 604 of an encapsulation 606 such as an EMC.

The die-pad 602 has corner pads 608, side pads 610, and a die attach pad 612. Along a single axis 614, partial saw isolation grooves 616 are cut into the die-pad 602 and the bottom surface 604 of the encapsulation 606.

The partial saw isolation grooves 616 isolate the side pads 610 and the die attach pad 612. The corner pads are connected by a strip 618, which is on the single axis 614 and therefore not cut by the partial saw isolation grooves 616.

The corner pads 608 are connected by an elevated leadframe element such as a raised strip 620 bridging the partial saw isolation grooves 616.

It has been unexpectedly discovered that using the partial saw isolation grooves 616 along the single axis 614 greatly improves cycle time and throughput. This technique decreases manufacturing overhead costs per unit.

Figure 7:
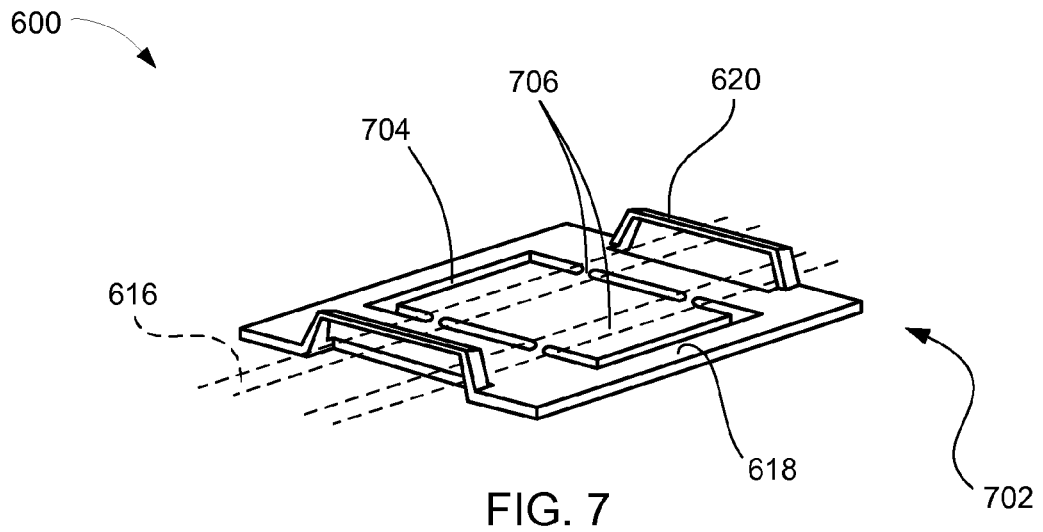
FIG. 7 is an isometric view of the integrated circuit package system of FIG. 6 in a lead-frame inspection phase of manufacture.

Referring now to FIG. 7, therein is shown an isometric view of the integrated circuit package system 600 of FIG. 6 in a lead-frame inspection phase of manufacture. The integrated circuit package system 600 is shown with a lead-frame 702.

The lead-frame 702 has predefined slots 704 and structural interconnects 706. The structural interconnects 706 are along the partial saw isolation grooves 616 that are shown overlapping the pre-defined slots 704. The raised strip 620 is shown connecting the corner pads 608.

Figure 8:
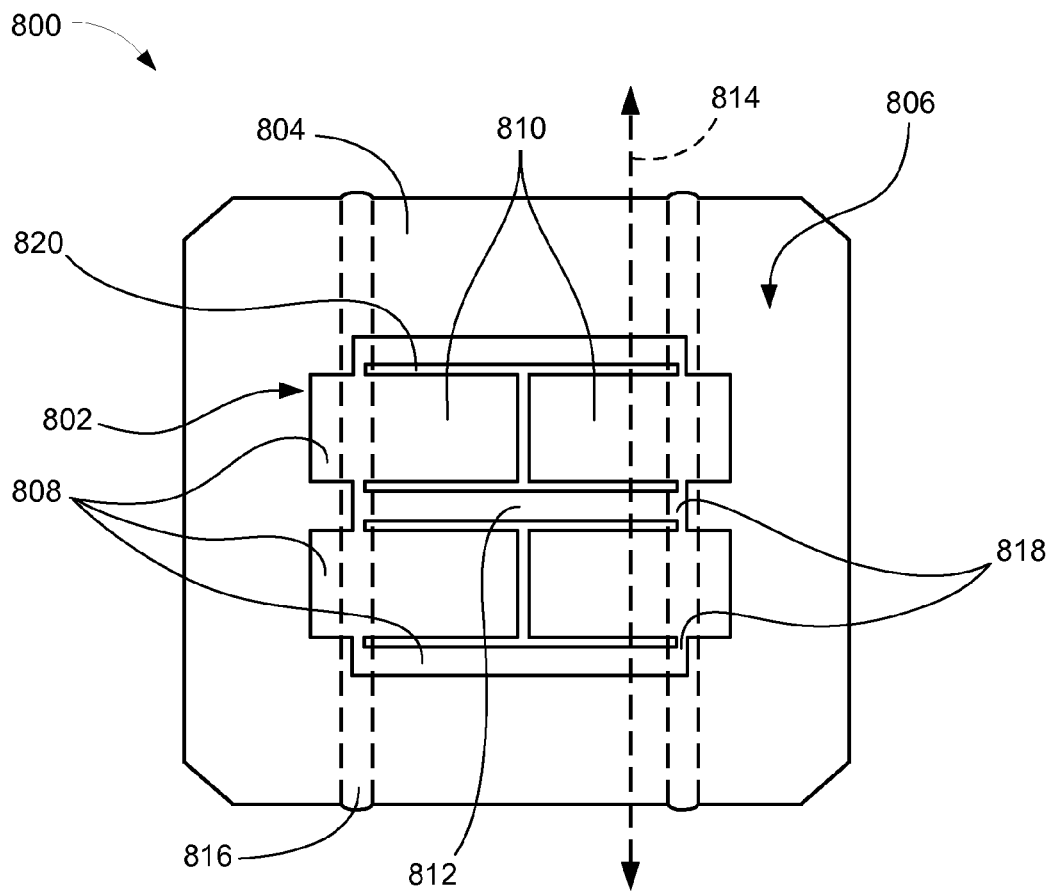
FIG. 8 is a bottom view of an integrated circuit package system in a fifth embodiment of the present invention, and in a pre-partial saw isolation phase of manufacture.

Referring now to FIG. 8, therein is shown a bottom view of an integrated circuit package system 800 in a fifth embodiment of the present invention, and in a pre-partial saw isolation phase of manufacture. The integrated circuit package system 800 is shown having a die-pad 802 exposed from a bottom surface 804 of an encapsulation 806 such as an EMC.

The die-pad 802 has side pads 808, multiple die attach pads 810, and a center pad 812. Along a single axis 814, partial saw isolation paths 816 are shown across the die-pad 802 and the bottom surface 804 of the encapsulation 806.

Along the partial saw isolation paths 816, structural interconnects 818 will be removed. It has been unexpectedly discovered that using the partial saw isolation paths 816 along the single axis 814 greatly improves cycle time and throughput. This technique decreases manufacturing overhead costs per unit.

Predefined slots 820 are shown partitioning the die-pad 802 to create the multiple die attach pads 810 and the side pads 808. The predefined slots 820 are filled with the encapsulation 806.

Figure 9:
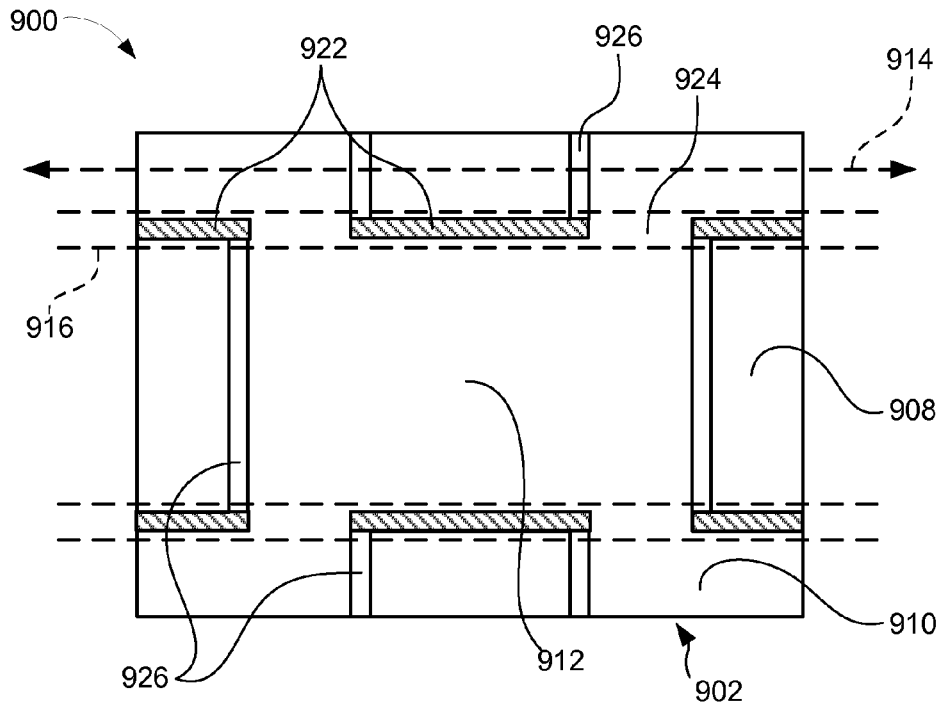
FIG. 9 is a top view of an integrated circuit package system in a sixth embodiment of the present invention and in a pre-plating phase of manufacture.

Referring now to FIG. 9, therein is shown a top view of an integrated circuit package system 900 in a sixth embodiment and in a pre-plating phase of manufacture. The integrated circuit package system 900 is shown having a die-pad 902 such as a copper die-pad.

The die-pad 902 has side pads 908, corner pads 910, and a center pad 912. Along a single axis 914, partial saw isolation paths 916 are shown across the die-pad 902. Along the partial saw isolation paths 916, are half etched grooves 922.

The half etched grooves 922 are grooves etched partially through the die-pad 902. The half etched grooves 922 serve to selectively isolate portions of the die-pad 902.

Along the partial saw isolation paths 916, are un-etched depth indicator regions 924. The un-etched depth indicator regions 924 will not be isolate adjacent pads such as corner pads 910 and the center pad 912 along the partial saw isolation paths 916.

It has been unexpectedly discovered that using the partial saw isolation paths 916 along the single axis 914 greatly improves cycle time and throughput. This technique decreases manufacturing overhead costs per unit. Predefined slots 926 are shown partitioning the die-pad 902 perpendicular to the partial saw isolation paths 916.

Figure 10:
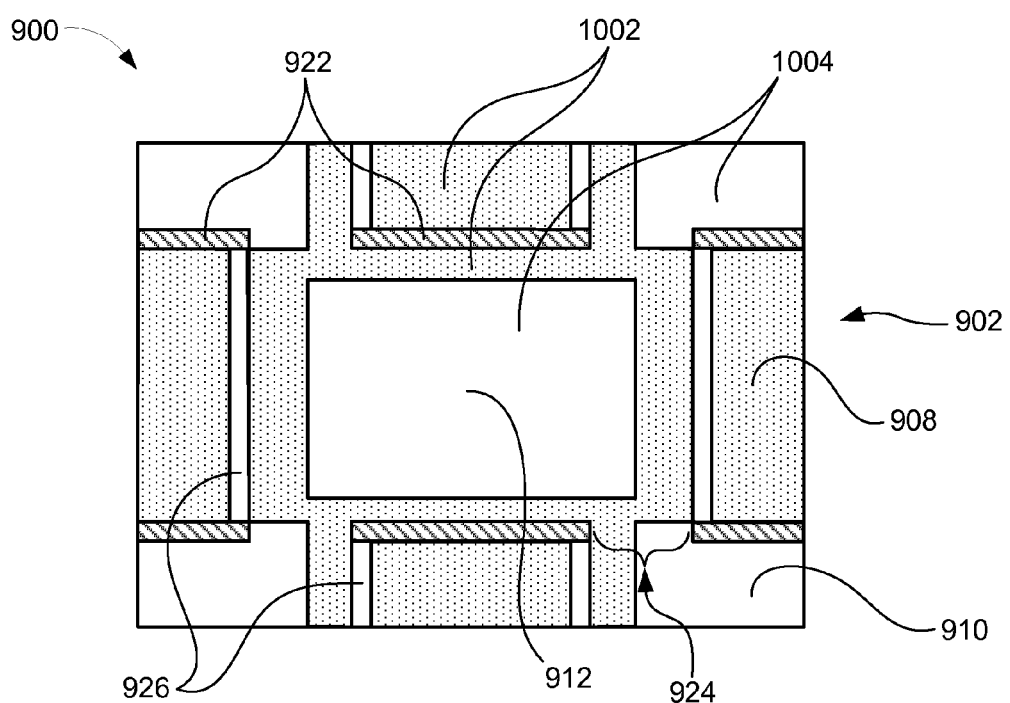
FIG. 10 is a top view of the integrated circuit package system of FIG. 9 in a post plating phase of manufacture.

Referring now to FIG. 10, therein is shown a top view of the integrated circuit package system 900 of FIG. 9 in a post plating phase of manufacture. The integrated circuit package system is shown having a plated layer 1002 such as a silver plated layer attached above the die-pad 902.

The plated layer 1002 covers the side pads 908. The plated layer 1002 does not entirely cover the die-pad 902 but leaves un-plated portions 1004 on the center pad 912 and the corner pads 910.

Figure 11:
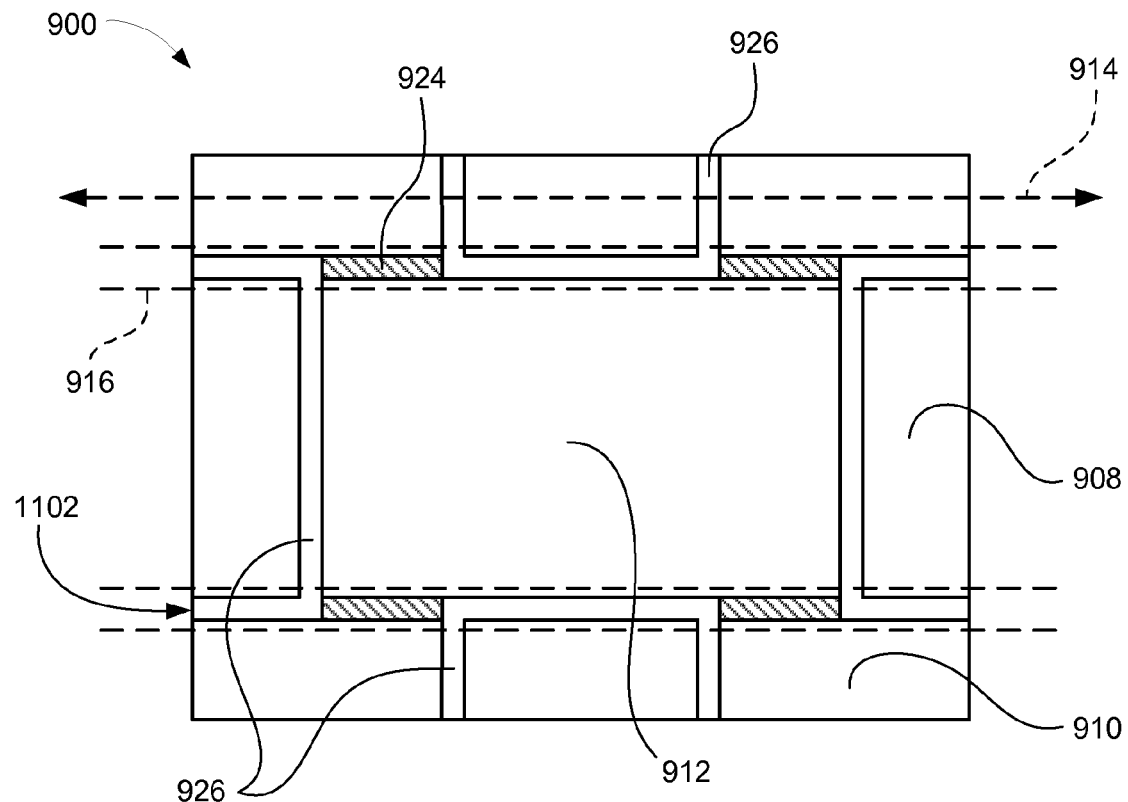
FIG. 11 is a bottom view of the integrated circuit package system of FIG. 9 in a post partial saw isolation phase of manufacture.

Referring now to FIG. 11, therein is shown a bottom view of the integrated circuit package system 900 of FIG. 9 in a post partial saw isolation phase of manufacture. The integrated circuit package system 900 is shown having partial saw isolation grooves 1102 cut along the partial saw isolation paths 916 of the die-pad 902.

The un-etched depth indicator regions 924 are shown along the partial saw isolation grooves 1102. The un-etched depth indicator regions 924 visibly show, on inspection, whether the partial saw isolation grooves 1102 are too shallow, too deep, or sufficient.

The predefined slots 926 perpendicular to the partial saw isolation grooves 1102 are shown fully through the die-pad 902. The center pad 912 is electrically connected to the corner pads 910 by the un-etched depth indicator regions 924, while the side pads 908 are isolated electrically from the center pad 912.

Figure 12:
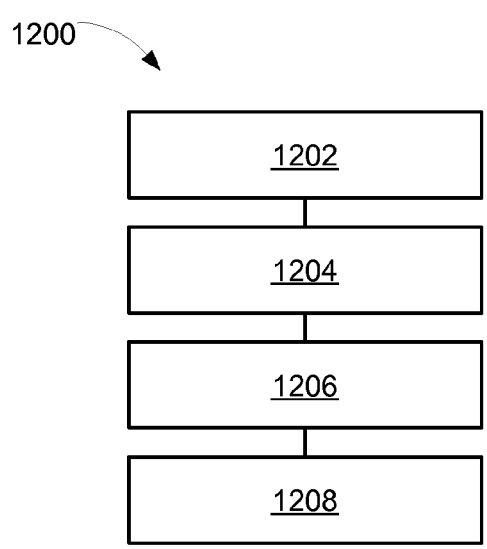
FIG. 12 is a flow chart of a system for manufacturing the integrated circuit package system of FIG. 1 in an embodiment of the present invention.

Referring now to FIG. 12, therein is shown a flow chart of a system 1200 for manufacturing the integrated circuit package system 100 of FIG. 1 in an embodiment of the present invention. The system 1200 includes providing a die-pad with a predefined slot and an integrated circuit attached to the die-pad in a block 1202; connecting the integrated circuit to the die-pad with a bond wire in a block 1204; encapsulating the integrated circuit and the bond wire with an encapsulation in a block 1206; and partitioning the die-pad with partial saw isolation grooves along a single axis, and into a side pad, and a die attach pad in a block 1208.

Thus, it has been discovered that the partial saw isolation grooves along a single axis of the present invention furnishes important and heretofore unknown and unavailable solutions, capabilities, and functional aspects for integrated circuit packages. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
providing a die-pad partitioned to a side pad and a die attach pad having an edge with a predefined slot collinear with the edge;
attaching an integrated circuit to the die-pad;
connecting the integrated circuit to the die-pad with a bond wire;
encapsulating the integrated circuit and the bond wire with an encapsulation; and
forming partial saw isolation grooves along a single axis of the encapsulation, the partial saw isolation grooves overlapping the predefined slot and separating the side pad from the die attach pad.

2. The method as claimed in claim 1 wherein:
partitioning the die-pad creates corner pads connected with a strip on a bottom surface of the encapsulation.

3. The method as claimed in claim 1 wherein:
partitioning the die-pad creates multiple die attach pads.

4. The method as claimed in claim 1 wherein:
providing the die-pad with the predefined slot includes providing the predefined slot along a partial saw isolation path.

5. The method as claimed in claim 1 wherein:
providing the die-pad with the predefined slot includes providing a die-pad with the predefined slots that are not coplanar.

6. A method for manufacturing an integrated circuit package system comprising:
providing a lead-frame with a die-pad partitioned to a side pad and a die attach pad having an edge, die attach paddle bars, and a predefined slot collinear with the edge;
attaching an integrated circuit to the die-pad;
connecting the integrated circuit to the die-pad with a bond wire;
connecting the die-pad with an elevated lead-frame element;
encapsulating the integrated circuit and the bond wire with an encapsulation; and
forming partial saw isolation grooves along a single axis of the encapsulation, the partial saw isolation grooves overlapping the predefined slot and separating the side pad from the die attach pad.

7. The method as claimed in claim 6 wherein:
connecting the die-pad with the elevated lead-frame element includes connecting the die-pad with a raised strip.

8. The method as claimed in claim 6 further comprising:
etching half etched grooves along the partial saw isolation grooves while leaving un-etched depth indicator regions along the partial saw isolation grooves.

9. The method as claimed in claim 6 wherein:
connecting the die-pad with the elevated lead-frame element includes connecting the die-pad with a side bar or an additional tie bar.

10. The method as claimed in claim 6 wherein:
connecting the die-pad with the elevated lead-frame element includes connecting the die-pad with an elevated ring.

11. An integrated circuit package system comprising:
a side pad;
a die attach pad adjacent to the side pad, the die attach pad having an edge;
a predefined slot collinear to the edge of the die attach pad;
an integrated circuit attached to the die attach pad;
a bond wire connected to the integrated circuit and to the die attach pad;
an encapsulation encapsulating the integrated circuit and the bond wire; and
partial saw isolation grooves along a single axis of the encapsulation, the partial saw isolation grooves overlapping the predefined slot.

12. The system as claimed in claim 11 further comprising:
corner pads connected with a strip on a bottom surface of the encapsulation.

13. The system as claimed in claim 11 wherein:
the partial saw isolation grooves adjacent to multiple die attach pads.

14. The system as claimed in claim 11 wherein:
the predefined slot is along a partial saw isolation path.

15. The system as claimed in claim 11 wherein:
the predefined slots are not coplanar.

16. The system as claimed in claim 11 further comprising:
die attach paddle bars; and
an elevated lead-frame element, connected to the die attach paddle bars, above a bottom surface of the encapsulation.

17. The system as claimed in claim 16 wherein:
the elevated lead-frame element is a raised strip.

18. The system as claimed in claim 16 further comprising:
half etched grooves etched along the partial saw isolation grooves while leaving un-etched depth indicator regions along the partial saw isolation grooves.

19. The system as claimed in claim 16 wherein:
the elevated lead-frame element is a side bar or an additional tie bar.

20. The system as claimed in claim 16 wherein:
the elevated lead-frame element is an elevated ring.

* * * * *